(12) United States Patent
Masuyuki

(10) Patent No.: US 6,545,284 B1
(45) Date of Patent: Apr. 8, 2003

(54) FACE POSITION DETECTION METHOD AND APPARATUS, AND EXPOSURE METHOD AND EXPOSURE APPARATUS, A PRODUCTION METHOD FOR AN EXPOSURE APPARATUS AND A PRODUCTION METHOD FOR A SEMICONDUCTOR DEVICE

(75) Inventor: Takashi Masuyuki, Tokyo (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/610,149

(22) Filed: Jul. 5, 2000

(30) Foreign Application Priority Data

Jul. 8, 1999 (JP) .......... 11-195092
May 19, 2000 (JP) .......... 2000-149071

(51) Int. Cl.$^7$ .......... G03F 7/207; G01B 11/00
(52) U.S. Cl. .......... 250/559.3; 250/548; 250/559.29; 250/559.37; 356/399; 356/401; 355/53
(58) Field of Search .......... 250/559.29, 559.3, 250/559.37, 559.4, 548; 356/399, 401, 622, 615; 355/53, 55

(56) References Cited

U.S. PATENT DOCUMENTS

| | | | | |
|---|---|---|---|---|
| 5,118,957 A | * | 6/1992 | Kawashima et al. | 250/561 |
| 5,191,200 A | | 3/1993 | Van der Werf et al. | 250/201.4 |
| 5,323,016 A | * | 6/1994 | Yamada et al. | 250/561 |
| H1463 H | | 7/1995 | Ota | 430/22 |
| 5,448,332 A | * | 9/1995 | Sakakibara et al. | 355/53 |
| 5,510,892 A | * | 4/1996 | Mizutani et al. | 356/139.1 |
| 5,569,930 A | | 10/1996 | Imai | 250/559.4 |
| 5,602,400 A | * | 2/1997 | Kawashima | 250/548 |
| 5,751,428 A | * | 5/1998 | Kataoka et al. | 356/401 |
| 5,920,398 A | * | 7/1999 | Iwanaga et al. | 356/401 |
| 5,929,983 A | * | 7/1999 | Lu | 356/138 |
| 5,998,801 A | * | 12/1999 | Imai | 250/548 |
| 6,040,909 A | * | 3/2000 | Hasegawa et al. | 356/375 |
| 6,163,369 A | * | 12/2000 | Yamada et al. | 355/55 |
| 6,172,373 B1 | * | 1/2001 | Hara et al. | 250/548 |

FOREIGN PATENT DOCUMENTS

| | | |
|---|---|---|
| EP | 1 052 683 A1 | 11/2000 |
| JP | 3-34233 | 4/1991 |
| JP | 3-91916 | 4/1991 |

OTHER PUBLICATIONS

English–language translation of JP 3–34233.

* cited by examiner

*Primary Examiner*—Robert H. Kim
*Assistant Examiner*—Allen C. Ho
(74) *Attorney, Agent, or Firm*—Oliff & Berridge, PLC

(57) ABSTRACT

The invention provides a face position detection method and a face position detection apparatus which can perform detection of the face position of a substrate with high precision, even when a pattern having a large stepped portion is formed by means of a plurality of layers on the surface of the substrate, and an exposure method and an exposure apparatus. Measurement beams S1 to S9 are irradiated onto a plurality of places on the surface of a substrate (object) W using a beam irradiation system (irradiation system) 4, the plurality of measurement beams S1 to S9 from the surface of the substrate W are then detected using a beam reception system (detection system) 5, and face positional information for the surface of the substrate W is obtained based on the detection results for the plurality of measurement beams S1 to S9 using a signal processing unit 41. With at least one measurement beam S9 of the plurality of measurement beams, at least either one of the shape and size thereof on the surface of the substrate W is set to be smaller than at least either one of the shape and size of the other measurement beams S1 to S8 on the surface of the substrate W.

21 Claims, 4 Drawing Sheets

FACE POSITION DETECTION METHOD AND APPARATUS, AND EXPOSURE METHOD AND EXPOSURE APPARATUS, A PRODUCTION METHOD FOR AN EXPOSURE APPARATUS AND A PRODUCTION METHOD FOR A SEMICONDUCTOR DEVICE

BACKGROUND OF THE INVENTION

1. Field of the Invention

The present invention relates to a face position detection method and a face position detection apparatus, and an exposure method and an exposure apparatus, a production method for an exposure apparatus and a production method for a semiconductor device, used in an exposure step in, for example, thin-film magnetic head production.

2. Description of the Related Art

Heretofore, various exposure apparatus have been used when manufacturing thin-film magnetic heads, semiconductor devices or liquid crystal display devices by a photolithography process. Presently however, exposure apparatus are typically being used, which transfer a pattern image formed on a photo mask or a reticle (hereinafter, referred to as a "mask") onto a substrate, on the surface of which a photosensitive material such as a photoresist or the like is applied, via a projection optical system.

Recently, with a pattern projected onto an exposure area (shot area) on the substrate being made minute, the numerical aperture NA of the projection optical system of the exposure apparatus is set large, and as a result, the depth of focus of the projection optical system becomes shallow. Therefore, such an exposure apparatus is provided with an auto focus mechanism for adjusting the position of the substrate projection optical system in the direction of the optical axis, and a leveling mechanism for adjusting the inclination of the substrate with respect to the optical axis, in order to accommodate the exposure area on the substrate within the depth of focus of an imaging plane (focal position) of the projection optical system.

The auto focus leveling mechanism comprises, as an example, a beam irradiation system for irradiating beams onto a plurality of measurement points on the exposure area on the substrate, from an inclined direction with respect to the optical axis of the projection optical system for projecting, for example, an image of a slit pattern serving as a probe pattern, and a beam photodetecting system for receiving reflected light of the image on the plurality of probe patterns and re-imaging the image on the photodetector. Then, after the position of the exposure area on the substrate with respect to the focal position of the projection optical system, and the inclination of the exposure area on the substrate with respect to the optical axis have been detected, based on the detection signals of the beam photodetecting system corresponding to the plurality of measurement points, the exposure area on the substrate is subjected to positional adjustment in the direction of the optical axis (focal position adjustment) and inclination adjustment with respect to the optical axis (leveling adjustment) of the projection optical system.

The focal position adjustment and the leveling adjustment are performed by comparing a position of the probe pattern image on the photodetector which changes when the exposure area on the substrate is moved in the direction of the optical axis of the projection optical system or the exposure area on the substrate is inclined with respect to the optical axis, and a position of the probe pattern image predetermined at the time of arranging the exposure area on the substrate at a focal position of the projection optical system, and moving a table on which the substrate is mounted in the direction of the optical axis of the projection optical system or inclining the table with respect to the optical axis thereof, so that the amount of discrepancy between these images is within a predetermined range. In this case, the focal position adjustment is performed based on, for example, the average value of respective detection signals corresponding to all the measurement points, and the leveling adjustment is performed so as to match the substrate with the least squares approximation plane for the respective detection signals. That is to say, the focal point adjustment and the leveling adjustment are performed with respect to all the plurality of measurement points on the substrate. Then, a pattern image of the mask is projected onto the substrate having been subjected to the focal point adjustment and the leveling adjustment via the projection optical system, to thereby form a pattern on the surface.

The pattern to be formed on the substrate in this manner is formed by repeating lithography steps such as exposure, development and the like, while changing a plurality of masks, and is in a rectangular shape having a stepped portion comprising a plurality of layers. In this case, particularly in a production process for thin-film magnetic heads for a magnetic disk apparatus, there may be a case where the difference of elevation (of the stepped portion comprising the plurality of layers) between the substrate surface and the thin-film magnetic head is relatively large, for example, 10 to 20 $\mu$m. When a beam for detecting the face position is irradiated onto the substrate having a pattern with low flatness, the beam may be irradiated at a time so as to span over the concave and convex portions in the stepped portion. Since the reflected light of the beam at that time is not stable, then in particular, the position of the exposure area on the substrate with respect to the focal position of the projection optical system cannot be detected with high precision.

Moreover, the focal position adjustment is performed based on the average value of the detection signals corresponding to all the plurality of measurement points. Hence, the precision of the focal position adjustment in a certain area on the substrate decreases. That is to say, if the focal position adjustment is performed with respect to a pattern having, for example, a large stepped portion, the focal position of the projection optical system does not coincide with the concave portion or convex portion in the stepped portion. Therefore, when a focus is to be adjusted only on the concave portion or the convex portion, focal position adjustment cannot be performed with high precision. Moreover, since the focal position adjustment and the leveling adjustment is performed using detection signals corresponding to all the plurality of measurement points, the processing time for calculating the optimum position of the substrate in the direction of the optical axis and the optimum inclination angle with respect to the optical axis becomes long.

On the other hand, such a pattern is formed by overlapping a plurality of layers by means of a multiplicity of exposures using a plurality of masks. However in this case, the substrate thermally expands due to heating from the exposure light. Hence there may be a case where the layers cannot be overlapped with high precision.

SUMMARY OF THE INVENTION

In view of the above situation, it is an object of the present invention to provide a face position detection method and a face position detection apparatus which can perform detection of the face position of a substrate with high precision, even when a pattern having a large stepped portion is formed by means of a plurality of layers on the surface of the substrate, and an exposure method and an exposure apparatus, a production method for the exposure apparatus and a production method for a semiconductor device.

To solve the above described problems, the present invention adopts the following constructions associated with FIG. 1 to FIG. 6 showing an the embodiment.

A face positional information detection method of the present invention is a method for detecting face positional information for the surface of an object (W), comprising steps for: irradiating measurement beams (S1 to S9) onto a plurality of places on the surface of an object; detecting the plurality of measurement beams from the surface of the object; and determining face positional information for the surface of the object based on the detection results for the plurality of measurement beams, and is characterized in that, in the step for irradiating the measurement beams, at least either one of the shape and size of at least one (S9) of the plurality of measurement beams on the surface of the object is smaller than at least either one of the shape and size of the other measurement beams (S1 to S8) on the surface of the object. According to the present invention, even if there is formed a stepped portion on the surface of the object (W), the measurement beam (S9), at least either one of the shape and size of which is set to be small, is irradiated so as to avoid the stepped portion. Therefore, the face position can be detected with high precision, without being affected by the stepped portion.

Such a face position detection method is realized by a face position detection apparatus having an irradiation system (4) for irradiating measurement beams onto a plurality of places on the surface of the object (W), and a detection system (5) arranged in a predetermined positional relationship to the irradiation system, for detecting the plurality of measurement beams from the surface of the object, and characterized in that in the irradiation system at least either one of the shape and size of at least one (S9) of the plurality of measurement beams on the surface of the object is smaller than at least either one of the shape and size of the other measurement beams (S1 to S8) on the surface of the object.

Then, by detecting the position of the surface of the object (W) with respect to a predetermined reference position, using at least one measurement beam (S9), the position of the surface of the object (W) with respect to the reference position is detected with high precision by the measurement beam irradiated so as to avoid the stepped portion. Moreover, by detecting the inclination of the surface of the object (W) with respect to a predetermined reference surface, using the other measurement beams (S1 to S8), the inclination of the surface of the object can be detected with high precision, based on the information for the plurality of points on the surface of the object (W). At that time, by arranging the at least one measurement beam approximately in the center of the plurality of measurement beams irradiated onto the surface of the object (W), the positional detection of the surface of the object (W) with respect to the reference position can be performed with high precision at a position approximately in the center on the surface of the object (W).

At the time of detecting the face positional information, by irradiating the at least one measurement beam (S9) onto at least one flat portion (100) formed on the surface of the object (W) beforehand, adverse effects on the face position detection due to the stepped portion can be effectively prevented. Therefore, face position detection can be performed with high precision. In this case, by setting the irradiation area of the at least one measurement beam (S9) on the surface of the object (W) to be smaller than the area of the flat portion (100), adverse effects on the face position detection due to the stepped portion can be reliably prevented. Therefore, face position detection, and in particular, position detection of the object face with respect to the reference position, can be performed with high precision.

A first exposure method according to the present invention is a method for exposing a substrate by projecting onto the substrate (W) a pattern image formed on a mask (M), comprising steps for: irradiating measurement beams (S1 to S9) onto a plurality of places on a substrate; detecting the plurality of measurement beams from the substrate; and adjusting the relative position of the projected image of the pattern and the substrate based on the detection result, and is characterized in that, in the step for irradiating the measurement beams, at least either one of the shape and size of at least one (S9) of the plurality of measurement beams on the surface of the object is smaller than at least either one of the shape and size of the other measurement beams (S1 to S8) on the surface of the object. According to the first exposure method, even if there is formed a stepped portion on the surface of the object (W), the measurement beam (S9), at least either one of the shape and size of which is set to be small, is irradiated so as to avoid the stepped portion.

The first exposure method is realized by a first exposure apparatus for exposing a substrate (W) by projecting onto the substrate a pattern image formed on a mask (M), having an irradiation system (4) for irradiating measurement beams (S1 to S9) onto a plurality of places on a substrate, and a detection system (5) arranged in a predetermined positional relationship to the irradiation system, for detecting the plurality of measurement beams from the substrate, and characterized in that in the irradiation system at least either one of the shape and size of at least one (S9) of the plurality of measurement beams on the surface of the object is smaller than at least either one of the shape and size of the other measurement beams (S1 to S8) on the surface of the object.

Moreover, with the first exposure method, by further having a step for detecting a position of the substrate (W) with respect to an imaging face of the pattern, using the at least one measurement beam (S9), the position of the substrate (W) with respect to the imaging face can be detected with even higher precision by the measurement beam. Furthermore, with the first exposure method, by further having a step for detecting an inclination of the substrate (W) with respect to an imaging face of the pattern, using the other measurement beams (S1 to S8), the inclination of the substrate with respect to the imaging face can be detected with high precision based on the information for the plurality of points on the surface of the substrate (W).

Furthermore, with the first exposure method, the at least one measurement beam (S9) is irradiated onto at least one flat portion formed beforehand on the substrate (W). Hence adverse effects due to the stepped portion can be efficiently prevented In this case, the flat portion includes a non-pattern area (100), onto which the pattern image of the mask (M) formed within each of a plurality of shot areas formed on the substrate (W) is not projected. Hence, adverse effects on the face position detection due to the stepped portion can be reliably prevented, enabling precise adjustment of the focal position, and as a result, enabling accurate exposure processing. Further, the first exposure method is preferably applied to a substrate for producing thin-film magnetic heads having a relatively large stepped portion.

A first production method for semiconductor devices according to the present invention is characterized by having a step for projection exposing a pattern on a mask (M) onto a substrate (W) by using the first exposure method. According to the first production method for semiconductor devices, semiconductor devices can be produced efficiently.

A production method for the first exposure apparatus according to the present invention is a production method for an exposure apparatus for exposing a substrate (W) by projecting onto the substrate a pattern image formed on a mask (M), characterized in that an irradiation system (4) for irradiating measurement beams (S1 to S9) onto a plurality of places on a substrate is provided, and a detection system (5) arranged in a predetermined positional relationship to the irradiation system, for detecting the plurality of measurement beams from the substrate is provided, and in the irradiation system at least either one of the shape and size of at least one (S9) of the plurality of measurement beams on the surface of the object is smaller than at least either one of the shape and size of the other measurement beams (S1 to S8) on the surface of the object. According to the production method for the first exposure apparatus, the apparatus can be easily produced, while maintaining at least one of the mechanical precision, electrical precision and optical precision required for the apparatus.

A second exposure method according to the present invention is a method for exposing a substrate by projecting onto a substrate CW) a pattern image formed on a mask (M), comprising steps for: irradiating measurement beams (S1 to S9) onto a plurality of places on a substrate; detecting the plurality of measurement beams from the substrate; and adjusting the relative position of the projected image of the pattern and the substrate based on the detection results, and characterized in that, in the step for detecting the measurement beams, a position of the substrate with respect to an imaging face of the pattern is detected by using at least one (S9) of the plurality of measurement beams, and an inclination of the substrate with respect to the imaging face of the pattern is detected by using the other measurement beams (S1 to S8). According to the second exposure method, while considering the inclination of the substrate (W), it becomes possible to adjust the focal position in a specific area on the substrate, enabling improvement in the precision of position adjustment. Hence, precise exposure processing can be performed.

The second exposure method is realized by a second exposure apparatus for exposing a substrate (W) by projecting onto the substrate a pattern image formed on a mask (M), having an irradiation system (4) for irradiating measurement beams (S1 to S9) onto a plurality of places on a substrate, and a detection system (5) arranged in a predetermined positional relationship to the irradiation system, for detecting the plurality of measurement beams from the substrate, and characterized in that the detection system detects the position of the substrate with respect to an imaging face of the pattern by using at least one of the plurality of measurement beams, and detects an inclination of the substrate with respect to the imaging face of the pattern by using the other measurement beams.

Furthermore, with the second exposure method, the at least one measurement beam (S9) is irradiated onto at least one flat portion formed beforehand on the substrate (W). Hence adverse effects due to the stepped portion can be efficiently prevented. Hence, due to the precise face position detection exposure processing can be performed with high precision. Further, the second exposure method is preferably applied to a substrate for producing thin-film magnetic heads having a relatively large stepped portion.

A second production method for semiconductor devices according to the present invention is characterized by having a step for projection exposing a pattern on a mask (M) onto a substrate (W) by using the second exposure method. According to the second production method for semiconductor devices, semiconductor devices can be produced efficiently.

A production method for the second exposure apparatus according to the present invention is a production method for an exposure apparatus for exposing a substrate (W) by projecting onto the substrate a pattern image formed on a mask (M), characterized in that an irradiation system (4) for irradiating measurement beams (S1 to S9) onto a plurality of places on a substrate is provided, and a detection system (5) arranged in a predetermined positional relationship to the irradiation system, for detecting the plurality of measurement beams from the substrate is provided, and the detection system detects the position of the substrate with respect to an imaging face of the pattern by using at least one (S9) of the plurality of measurement beams, and detects an inclination of the substrate with respect to the imaging face of the pattern by using the other measurement beams (S1 to S8). According to the production method for the second exposure apparatus, the apparatus can be easily produced, while maintaining at least one of the mechanical precision, electrical precision and optical precision required for the apparatus.

A third exposure method according to the present invention is an exposure method for sequentially exposing a plurality of shot areas on a substrate (W) as well as sequentially exposing a plurality of substrates, by projecting onto the substrate a pattern image formed on a mask (M), and is characterized by having steps for: mounting a substrate on a substrate holder (32) driven at the time of exposure processing; setting at least one time of; a time from mounting the substrate on the substrate holder until initiating exposure processing for the substrate, a time from completing exposure processing for the substrate using a first mask until initiating exposure processing for the substrate using a second mask different from the first mask, and a time from completing exposure processing for a first shot area on the substrate until initiating exposure processing for a second shot area to be exposed next; and executing exposure processing for the substrate based on the set time. According to the third exposure method, when divided areas on the plurality of substrates (W) are sequentially exposed, the interval time between each exposure can be set, thereby enabling prevention of deterioration in overlapping precision of layers due to thermal expansion of the substrate.

The third exposure method is realized by a third exposure apparatus for sequentially exposing a plurality of shot areas on a substrate (W) as well as sequentially exposing a plurality of substrates by projecting onto the substrate a pattern image formed on a mask (M), characterized by having: a substrate holder (32) for holding the substrate and driven at the time of exposure processing, and a control system (40) for setting at least one time of; a time from mounting the substrate on the substrate holder until initiating exposure processing for the substrate, a time from completing exposure processing for the substrate using a first mask until initiating exposure processing for the substrate using a second mask different from the first mask, and a time from completing exposure processing for a first shot area on the substrate until initiating exposure processing for a second shot area to be exposed next; and instructing the exposure processing for the substrate based on the set time.

Moreover, with the third exposure method, the at least one time is changed depending upon the layer on the substrate (W) to be subjected to the exposure processing, to optimally set the time for cooling the substrate which has been heated by the exposure processing, thereby preventing a drop in layer overlapping precision due to expansion and contraction of the substrate, enabling an improvement in exposure processing efficiency. Furthermore, with the third exposure method, by further having; a step for vacuum-attaching the substrate by means of the substrate holder, during the time from mounting the substrate (W) on the substrate holder (32) until the exposure processing for the substrate is initiated, and a step for releasing the vacuum-attached condition at the time of starting the exposure processing for the substrate, and vacuum-attaching the substrate again by means of the substrate holder, the difference in temperature between the substrate and the substrate holder is reduced by vacuum-attaching the substrate up until starting the exposure processing. Also by releasing the vacuum attachment once and then vacuum-attaching the substrate again, stress occurring in the substrate which is expanded and contracted by heating is released to thereby remove distortion occurring in the substrate. Consequently, face position detection and exposure processing can be precisely performed.

Also, with the third exposure method, by further having a step for adjusting the temperature of the substrate holder during the set time, the heat accumulated in the substrate holder is removed, and the temperature of the substrate holder is kept constant, so that the face position detection and the exposure processing can be performed accurately. Moreover, with the third exposure method, during the set time, by further having a step for keeping a stage on which the substrate is mounted stationary during the set time, time for decreasing the difference in temperature between the substrate and the substrate holder can be sufficiently ensured. Since the face position detection and exposure processing is performed after the deformation of the substrate due to heating has occurred, the face position detection and exposure processing can be performed accurately.

Preferably the third exposure method is applied to a substrate for producing a thin-film magnetic head having a relatively large stepped portion. In this case, at the time of exposure processing for forming a recording core of the thin-film magnetic head, by setting the at least one time longer than that for the exposure processing for forming other portions, the long exposure time requirement and the heat radiation after exposure of the recording core which is the part with the large stepped portion, can be reliably performed. Hence deterioration in overlapping precision of layers due to thermal expansion of the substrate can be prevented.

A third production method for semiconductor devices according to the present invention is characterized by having a step for projection exposing a pattern on a mask (M) onto a substrate (W) by using the third exposure method. According to the third production method for semiconductor devices, semiconductor devices can be produced efficiently.

A production method for the third exposure apparatus according to the present invention is a production method for an exposure apparatus for sequentially exposing a plurality of shot areas on a substrate (W) as well as sequentially exposing a plurality of substrates by projecting onto the substrate a pattern image formed on a mask (M), and is characterized by; providing a substrate holder (32) for holding the substrate and driven at the time of exposure processing, and a control system (40) for setting at least one time of; a time from mounting the substrate on the substrate holder until initiating exposure processing for the substrate, a time from completing exposure processing for the substrate using a first mask until initiating exposure processing for the substrate using a second mask different from the first mask, and a time from completing exposure processing for a first shot area on the substrate until initiating exposure processing for a second shot area to be exposed next; and instructing the exposure processing for the substrate based on the set time. According to the production method for the third exposure apparatus, the apparatus can be easily produced, while maintaining at least one of the mechanical precision, electrical precision and optical precision required for the apparatus.

A fourth exposure method according to the present invention is an exposure method for exposing a substrate (W) by projecting onto the substrate a pattern image formed on a mask (M), and is characterized by having steps for: selecting at least one measurement point to be used for detecting face positional information for the substrate from a plurality of measurement points, depending upon the condition of layers already formed on the substrate; detecting face positional information for the substrate based on positional information for the selected measurement point; and adjusting the relative position of the projected image of the substrate pattern and the substrate based on the detection results for the face positional information, and in the selection step, the plurality of measurement points are set beforehand for detecting the positional information for the substrate in a direction perpendicular to an imaging face of the pattern. According to the fourth exposure method, since at least one of the plurality of measurement points is selected according to the condition of the layers, by selecting a measurement point necessary and sufficient for detecting the face positional information, unnecessary detection of measurement points is prevented, enabling shortening of the processing time.

The fourth exposure method is realized by a fourth exposure apparatus for exposing a substrate (W) by projecting onto the substrate a pattern image formed on a mask (M), characterized by having: a selection device (40) for selecting at least one measurement point to be used for detecting face positional information for the substrate from a plurality of measurement points, depending upon the condition of layers already formed on the substrate; and a detection system (5) connected to the selection device for detecting the face positional information for the substrate based on the positional information for the selected measurement point, and in the selection device the plurality of measurement points are set beforehand for detecting the positional information for the substrate in a direction perpendicular to an imaging face of the pattern.

Moreover, with the fourth exposure method, when a stepped portion in the layer already formed on the substrate is large, the number of measurement points is increased, and when a stepped portion in the layer already formed on the substrate is small, the number of measurement points is decreased. As a result, when there is a big difference between the concave portion and the convex portion, the face positional information can be detected with high precision by using many measurement points, and when there is a small difference between the concave portion and the convex portion, a small number of measurement points is used. Hence, the processing time for detection can be shortened, enabling optimization of processing regardless of the size of difference between the concave portion and the convex portion. Furthermore, with the fourth exposure method, the measurement points are selected depending upon the information related to the layers on the substrate to be subjected to the exposure processing, enabling rapid and accurate selection of the measurement points.

Preferably the fourth exposure method is applied to a substrate for producing a thin-film magnetic head having a relatively large stepped portion. In this case, at the time of exposure processing for forming a recording core of the thin-film magnetic head, by selecting a larger number of measurement points than that for at the time of exposure processing for forming other portions, the face positional information can be detected with high precision, by using many measurement points with respect to the layer for forming the recording core.

A fourth production method for semiconductor devices according to the present invention is characterized by having a step for projection exposing a pattern on a mask (M) onto a substrate (W) by using the fourth exposure method. According to the fourth production method for semiconductor devices, semiconductor devices can be produced efficiently.

A production method for the fourth exposure apparatus according to the present invention is a production method for an exposure apparatus for exposing a substrate (W) by projecting onto the substrate a pattern image formed on a mask (M), characterized by providing: a selection device (40) for selecting at least one measurement point to be used for detecting face positional information for the substrate from a plurality of measurement points, depending upon the condition of layers already formed on the substrate; and a detection system (5) connected to the selection device for detecting the face positional information for the substrate based on the positional information for the selected measurement point, and in the selection device, the plurality of measurement points are set beforehand for detecting the positional information for the substrate in a direction perpendicular to an imaging face of the pattern. According to the production method for the fourth exposure apparatus, the apparatus can be easily produced, while maintaining at least one of the mechanical precision, electrical precision and optical precision required for the apparatus.

DETAILED DESCRIPTION OF THE PREFERRED EMBODIMENTS

Figure 1:
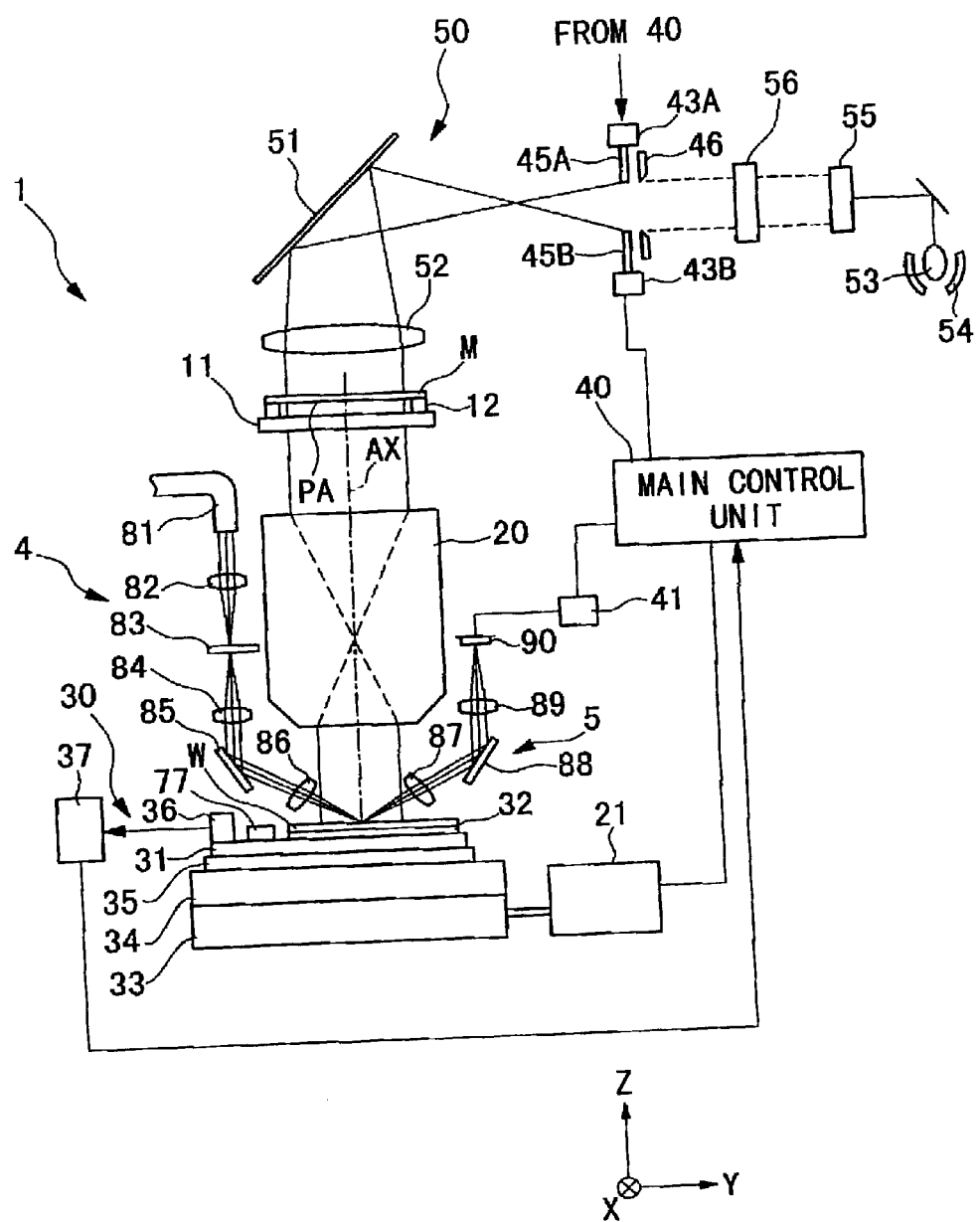
FIG. 1 is a block diagram showing one embodiment of an exposure apparatus having a face position detection apparatus of the present invention.

Below is a description of a face position detection method and a face position detection apparatus, as well as an exposure method and an exposure apparatus according to one embodiment of the present invention, with reference to drawings. Of these, FIG. 1 is a schematic block diagram of an exposure apparatus having the face position detection apparatus of the present invention. In FIG. 1, the exposure apparatus 1 comprises a mask holding portion 11 for holding a mask M having a pattern; a projection optical system 20 for projecting a pattern on the mask M held by the mask holding portion 11 onto a substrate (wafer) W; a substrate table 31 on which a substrate holding portion 32 is mounted for holding the substrate W; and an XY stage apparatus 30 for supporting the substrate table 31 movably in a two-dimensional direction in the X-Y plane. In this case, the optical axis AX of the projection optical system 20 coincides with the Z direction orthogonal to the X-Y plane. That is to say, the X-Y plane is in a relationship orthogonal to the optical axis AX of the projection optical system 20.

The XY stage apparatus 30 comprises a base 33, a Y stage 34 capable of reciprocating movement in the Y direction in FIG. 1 on the base 33, and the X stage 35 capable of reciprocating movement in the X direction orthogonal to the Y direction on the Y stage 34, and a substrate table 31 provided on the X stage 35. Moreover, the substrate holding portion (substrate holder) 32 is mounted on the substrate table 31, and the substrate W is vacuum-attached by the substrate holding portion 32.

The substrate table 31 is positioned in the XY direction on the X stage 35, and attached in a state such that movement in the axis direction and inclination are allowed. A mobile mirror 36 is fixed on the substrate table 31, and positional information obtained by an interferometer 37 disposed externally is supplied to a main control unit (control system) 40. The main control unit 40 controls the positioning operation of the Y stage 34, the X stage 35 and the substrate table 31 via a substrate drive 21 serving as a drive system, and also performs integrated control of the overall operation of the apparatus. Moreover, at one end portion on the substrate table 31, there is fixed a reference mark plate 77 on which various reference marks are formed for baseline measurement or the like for measuring a distance from a detection center of an alignment detection system (not shown) to the optical axis AX of the projection optical system 20 in an off-axis method.

The mask holding portion 11 has a vacuum-attachment portion 12 at four corners on the upper face thereof, and the mask M is held on the mask holding portion 11 via the vacuum-attachment portion 12. The mask holding portion 11 has an opening (not shown) corresponding to a pattern area PA which is an area on which the pattern on the mask M is formed, and is slightly movable in the X direction, the Y direction and the θdirection (in the rotation direction around the Z axis) by means of a drive (not shown), thereby giving a construction capable of positioning of the mask M so that the center of the pattern area PA (mask center) passes through the optical axis AX of the projection optical system 20.

With this exposure apparatus 1, alignment of the mask M and the substrate W is performed by the main control unit 40, based on detection signals from the alignment detection system. Hence, the substrate table 31 is driven and controlled in the Z direction and in the inclination direction by the main control unit 40 via the substrate drive 21 to thereby adjust the face position, such that the pattern face of the mask M and the surface of the substrate W become conjugate with respect to the projection optical system 20 and such that the imaging face of the projection optical system 20 coincides with the substrate W. In the positioned condition as described above, when the pattern area PA of the mask M is illuminated with the exposure light irradiated from the illumination optical system 50 including a mirror 51 and a main condenser lens 52 with an approximately uniform illuminance, the pattern image of the mask M is imaged on the substrate W applied with a photoresist on the surface thereof.

Here, the illumination optical system 50 comprises a light source 53 such as a mercury lamp or the like, an elliptical mirror 54 for condensing the exposure light irradiated from the light source 53, an input lens 55 for converting the condensed exposure light into an approximately parallel beam of light, a fly-eye lens 56 for forming a plurality of two-dimensional light sources on the focal plane on the back side (on the mask M side) by the incident beam of light output from the input lens 55, and a condenser lens system for condensing the exposure light irradiated from these two-dimensional light sources for illuminating the mask M with a uniform illuminance. Moreover, within the illumination optical system 50 in this embodiment, there is provided a mobile blind 45 as a blind having two mobile plates 45A and 45B. The arranged plane of the mobile blind 45 is conjugate with the pattern face of the mask M. In the vicinity of the mobile blind 45, there is also arranged a fixed blind 46 whose opening shape is fixed. The fixed blind 46 is a field stop with for example four knife edges surrounding a rectangular opening. The width of the rectangular opening in the vertical direction is regulated by the mobile blind 45. The mobile plates 45A and 45B are driven in the opening and closing direction by mobile blind drive mechanisms 43A, 43B. The operation of these drive mechanisms 43A, 43B is controlled by the main control unit 40 depending upon masking information from a face computer (not shown).

Furthermore, to detect the position of the surface of the substrate W in the Z direction (in the direction of the optical axis AX) when the substrate W is positioned in the exposure area of the pattern produced by the projection optical system 20, a multipoint focal position detection system is provided, which is one of the focus detection systems in an oblique-incidence method. The multipoint focal position detection system is formed from: a beam irradiation system (irradiation system) 4 comprising a bundle of optical fibers 81, a condensing lens 82, a pattern formation plate (setting device) 83, a lens 84, a mirror 85 and an irradiation object lens 86; and a beam photodetecting system (detection system) 5 comprising a condensing object lens 87, a directional diaphragm 88, an imaging lens 89, and a photodetector 90 having a photosensor serving as a plurality of photodetecting sensors.

Respective constituents of the multipoint focal position detection system will now be described. Measurement beams having a wavelength which is different from that of the exposure light and which does not expose the photoresist on the substrate W are guided from the illumination light source (not shown) via the bundle of optical fibers 81. The measurement beams irradiated from the bundle of optical fibers 81 illuminate the pattern formation plate 83 through the condensing lens 82. The measurement beams transmitted through the pattern formation plate 83 are projected onto the surface the substrate W through the lens 84, the mirror 85 and the irradiation object lens 86, and as a result, the pattern image on the pattern formation plate 83 is projected and imaged on the surface of the substrate W. The reflected light of the measurement beams reflected by the substrate W is projected onto the photodetecting face of the photodetector 90, through the condensing object lens 87 and the imaging lens 89. Detection signals (photoelectric conversion signals) from the plurality of photosensors of the photodetector 90 are then supplied to a signal processing unit (computing device) 41, and the signal processing unit 41 processes each detection signal and supplies the signals to the main control unit 40.

Figure 2:
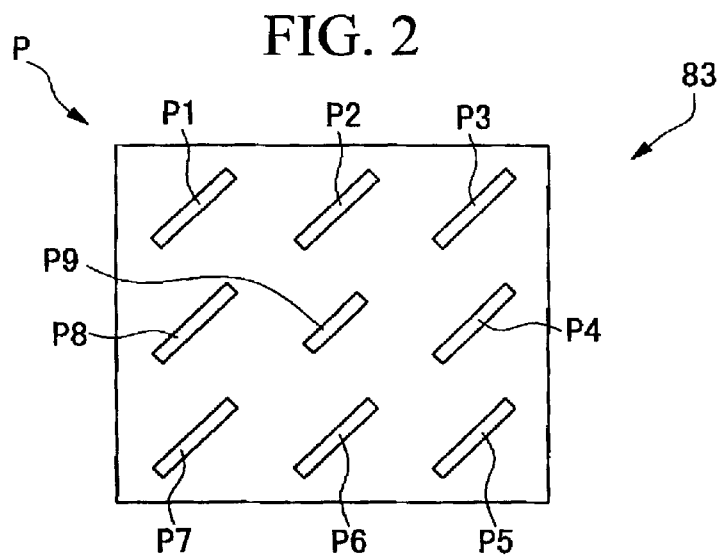
FIG. 2 is a diagram for explaining a pattern formation plate (setting device) according to the present invention.
Figure 3A:
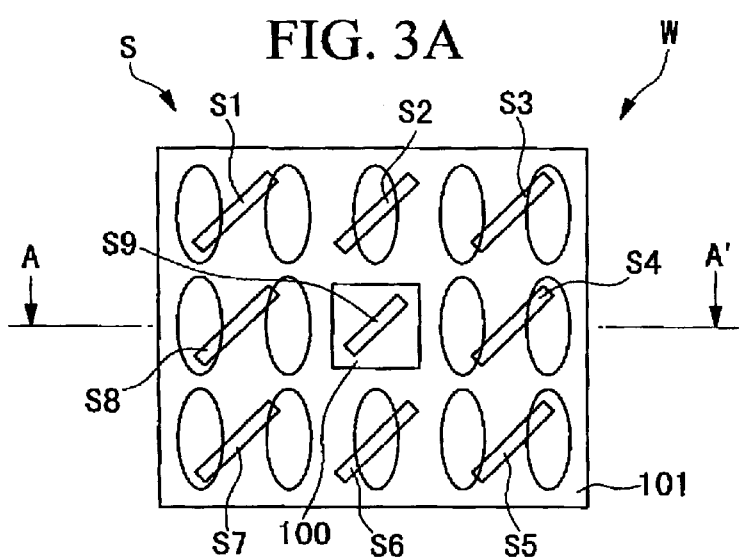
FIG. 3A is a diagram for explaining a beam irradiated onto a substrate by means of the setting device of FIG. 2.
Figure 3B:
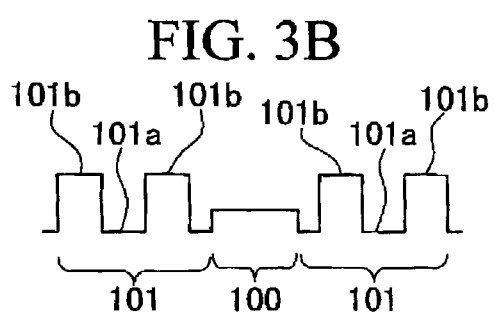
FIG. 3B is a sectional view taken along the line A–A' in FIG. 3A.
Figure 4:
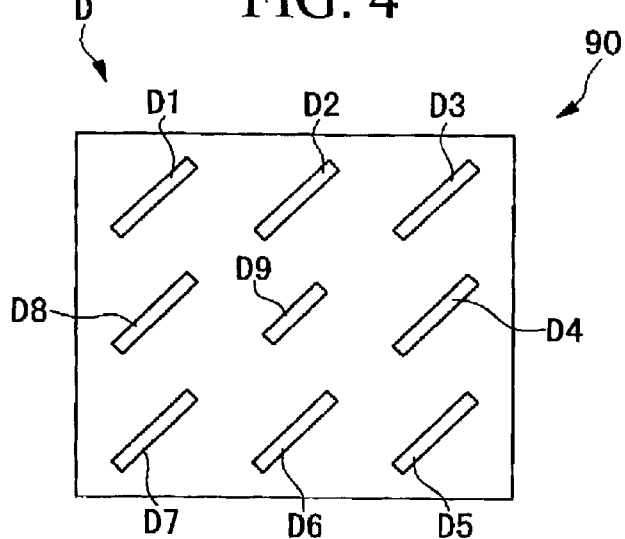
FIG. 4 is a diagram for explaining a photodetector for receiving the beam reflected on the substrate in FIG. 3.

Here, description is further made for the pattern on the pattern formation plate 83, the image of this pattern formed on the exposure face on the surface of the substrate W, and the photodetector 90 in which the photosensor is arranged and on which the image is re-imaged, with reference to FIGS. 2 to 4. Referring to FIG. 2, the pattern formation plate 83 comprises opening patterns P (P1 to P9) in slit form, arranged at equal spacing in the vertical and horizontal directions, and each opening pattern P is formed inclined at 45 degrees with respect to the directions of the four sides (in the X, Y directions) of the pattern formation plate 83. Further, the opening patterns P in FIG. 2 are nine in total, 3 lines by 3 rows, however, the number can be variously set such as, for example, 49 in total, 7 lines by 7 rows. Then, the images of these slit-form opening patterns P are projected onto the surface of the substrate W. Here, the measurement beams from the irradiation system 4 are irradiated onto the surface of the substrate W from a direction inclined at a predetermined angle with respect to the optical axis AX in the YZ plane. The reflected light of the measurement beams from the substrate W advances in a direction inclined at a predetermined angle with respect to the optical axis AX in the YZ plane, and symmetrical with the measurement beams from the illumination optical system 50, and is received by the beam photodetecting system 5. That is to say, if seen on a plan view, the measurement beams from the beam irradiation system 4 and the reflected light thereof advance from one direction to the other direction along the Y axis.

One opening pattern P9, of the opening patterns P, is formed such that the size thereof is smaller than other opening patterns P1 to P8. The one opening pattern P9 that is formed small is provided in the center of the array of all the opening patterns P1 to P9. Therefore, on a plurality of exposure areas on the surface of the substrate W (hereinafter, referred to as a "shot area"), as shown in FIG. 3A, slit images (measurement beams) S1 to S9 that are images of the total of nine slit-form opening patterns in the matrix array of 3 lines by 3 rows, inclined at 45 degrees with respect to the X axis and the Y axis, are formed at equal spacing along the X-axis and Y-axis directions. Of the images S of the opening patterns, a slit image S9 corresponding to the opening pattern P9 is formed smaller than the other slit images S1 to S8. At this time, the slit image S9 is arranged at the center of the array of all the slit images S1 to S9.

In a part of the shot area, there is formed beforehand one flat portion (non-pattern area) 100. In this case, the flat portion 100 is provided at the center of the shot area 101 formed on the substrate W. The flat portion is formed by providing in advance an area where there is no circuit pattern at the center of the pattern area of the mask, and projecting the non-pattern area where there is no circuit pattern onto the substrate. This is disclosed in detail in Japanese Unexamined Patent Application, First Publication No. Hei 5-216209 (U.S. Statutory Invention Registration No. H1463). In this embodiment, the flat portion is designated as a portion corresponding to one chip area of a plurality of chip areas (an area where one thin-film magnetic head is produced) formed in the shot area.

The shot area 101 comprises a pattern having a stepped portion, as shown in FIG. 3B (a sectional view taken along the line A–A' in FIG. 3A), and concave portions 101a and convex portions 101b are formed in the shot area 101 by the stepped portion. The flat portion 100 is formed at a lower position than the convex portions 101b in the shot area 101, and the size as seen in a plan view is set to be larger than that of the concave portions 101a and the convex portions 101b. Therefore, the slit image S9 corresponding to the opening pattern P9 is irradiated onto this flat portion 100. At this time, the size of the slit image S9 corresponding to one measurement beam irradiated from the opening pattern P9 is set to be smaller than the size of the flat portion 100. As a result, the one measurement beam from the opening pattern P9 irradiated onto the flat portion 100 is received by the photodetector 90 without being affected by the concave portions 101*a* and the convex portions 101*b* of the pattern.

On the other hand, the other measurement beams irradiated from the opening patterns P1 to P8 are irradiated to the shot area 101 arranged around the flat portion 100 to thereby form slit images S1 to S8 in the shot area 101. At that time, each of the respective slit images S1 to S8 is set to be large so that it spans over the concave portions 101*a* and the convex portions 101*b* formed in the shot area 101.

As shown in FIG. 4, the photodetector 90 is provided with photosensors D1 to D9 arranged in a matrix of 3 lines by 3 rows, corresponding to the slit images S1 to S9. Each photosensor D is arranged inclined at 45 degrees with respect to the X axis and the Y axis, respectively. On the front side (lower face in FIG. 1) of each photosensor D is arranged a slit-form stop (not shown) inclined at 45 degrees with respect to the X axis and the Y axis, as with the photosensor D. Moreover, the slit images S1 to S9 shown in FIG. 3A are respectively re-imaged on these photosensors D1 to D9. The detection signals of these respective photosensors D1 to D9 are processed by the signal processing unit 41. The signal processing unit 41 uses the detection signal of the photosensor D9 based on the slit image S9, which is one beam reflected by the flat portion 100, to calculate the position of the surface of the substrate W with respect to the focal position of the projection optical system 20. That is to say, the signal processing unit 41 serving as a first computing device calculates the position of the surface of the substrate W with respect to the focal position of the projection optical system 20, based on the detection signal from the photosensor D9 in the photodetector 90, of the beam photodetecting system 5 serving as a first detection system.

The main control unit 40 adjusts the focal position by moving the substrate W mounted on the substrate table 31 in the direction of the optical axis AX of the projection optical system 20 by means of the substrate drive 21, so that the surface position of the substrate W is disposed at a focal position of the projection optical system 20. In this case, the focal position adjustment is performed by comparing a position of the slit image S9 in the photosensor D9 of the photodetector 90, which is changed by moving the exposure area on the substrate W in the direction of the optical axis AX of the projection optical system 20, and a position of the slit image S9 determined beforehand at the time of arranging the exposure area on the substrate W at the focal position of the projection optical system 20, and moving the substrate table 31 on which the substrate W is mounted in the direction of the optical axis AX of the projection optical system 20, so that the amount of discrepancy between these images is within a predetermined range.

On the other hand, the signal processing unit 41 uses the detection signals from the photosensors D1 to D8 based on the slit images S1 to S8, which are the other measurement beams reflected by the shot area 101, to calculate the inclination of the surface of the substrate W with respect to the plane (reference surface) orthogonal to the optical axis AX of the projection optical system 20. That is to say, the signal processing unit 41 serving as a second computing device calculates the inclination of the surface of the substrate W with respect to the plane (reference surface) orthogonal to the optical axis AX of the projection optical system 20, based on the plurality of detection signals from the photosensors D1 to D8 in the photodetector 90, of the beam photodetecting system 5 serving as a second detection system. The main control unit 40 then performs leveling adjustment by inclining the substrate W mounted on the substrate table 31 with respect to the optical axis AX of the projection optical system 20 by means of the substrate drive 21, so that the inclination of the surface of the substrate W becomes a target value.

The leveling adjustment is performed by comparing positions of the slit images S1 to S8 in the photosensors D1 to D8 of the photodetector 90, which are changed by inclining the exposure area on the substrate W with respect to the optical axis of the projection optical system 20, and positions of the slit images S1 to S8 determined beforehand at the time of arranging the exposure area on the substrate W at the focal position of the projection optical system 20, and then inclining the substrate table 31 on which the substrate W is mounted with respect to the optical axis AX of the projection optical system 20 by means of the method of least squares, so that the amount of discrepancy between the plurality of images becomes a minimum. That is to say, the leveling adjustment is performed so as to match the surface of the substrate W with the least squares approximation plane for the detection value based on the slit images S1 to S8. In this case, the main control unit 40 performs the focal position adjustment and the leveling adjustment at the same time.

As described above, since the focal position adjustment is performed based on the reflected light of the slit image S9, serving as one measurement beam that is set to be smaller than the flat portion 100 provided in the center of the substrate W, focal position adjustment can be performed with high precision. That is to say, if the measurement beam for the focal position adjustment is irradiated spanning over the concave portion 101*a* or the convex portion 101*b* formed in the shot area 101, precise focal position adjustment cannot be performed. However, by setting the size (area) of one measurement beam on the surface of the substrate W, transmitted through the opening pattern P9, to be smaller than that of the plurality of measurement beams transmitted through the other opening patterns P1 to P8 on the surface of the substrate W, precise focal position adjustment can be performed.

In this case, by making the size (area) on the substrate W of the slit images S1 to S8 of the measurement beams transmitted through the opening patterns P1 to P8, and serving as the beams for leveling adjustment, as large as possible, it becomes possible to obtain a balancing effect for the leveling adjustment, using the detection results of the photosensors D1 to D8 based on the measurement beams other than the slit image S9 at the center. That is to say, by increasing the size (area) of the slit images S1 to S8 serving as the beams for leveling adjustment, precise leveling adjustment can be performed. With the leveling adjustment, other than the method of increasing the respective areas of the slit images S1 to S8, a method of increasing the number of the slit images is also possible. Moreover, the leveling adjustment may be performed using the detection signals from all the photosensors D1 to D9, including the detection signal from the photosensor D9 based on the slit image S9.

By forming a flat portion 100 beforehand on the substrate W, the slit image S9 serving as the beam for detecting the focal position is reflected by the flat portion 100, without being affected by the concave and convex portions in the shot area 101, and received by the photodetector 90, enabling precise focal position adjustment. Further, even if the flat portion 100 is not formed on the substrate W, by setting the one beam for focus adjustment to be small so that it is not affected by the concave and convex portions on the pattern, precise focal position adjustment is performed. That is to say, if one measurement beam is set to be smaller, for example, than the area of the concave portion 101a, the reflected light thereof is received by the photodetector 90 without being affected by the concave and convex portions. In other words, it is only necessary to set the size of one measurement beam such that it can be irradiated only on the flat portion in the pattern form. By setting the one measurement beam to be small, a construction is possible where the flat portion 100 is not formed on the substrate W.

On the other hand, by sufficiently increasing the size of the flat portion 100, it is also possible to set, for example, all the opening patterns P to be the same size, without making one measurement beam small on the substrate W, and designate one measurement beam irradiated onto the flat portion 100 as that for focal position adjustment, and designate the other measurement beams as those for leveling adjustment. That is to say, by using the reflected light of at least one measurement beam to perform the focal position adjustment, and by using the reflected light of the other measurement beams to perform the leveling adjustment, precise focal position adjustment can be performed in the flat portion 100 being a specific area on the substrate W. Moreover, with the size of one measurement beam for the focal position adjustment on the substrate W, instead of the method of decreasing the size of the one measurement beam to less than that of the other measurement beams, it is possible for example to make the area equal and change only the shape so as to match with the shape of the flat portion 100.

Furthermore, the flat portion 100 is not necessarily provided in the center of the substrate W, and it is also possible to provide the flat portion 100 at an end portion. In this case, the substrate state 31 is moved so that the flat portion 100 provided at an end portion of the substrate W is disposed in a position irradiated by the one beam for the focal position adjustment. Then, after performing the focal position adjustment, the substrate stage 31 is moved so that the optical axis AX of the projection optical system 20 coincides with the center of the exposure area of the substrate W. After this it is possible to also perform the leveling adjustment. It is of course possible to perform the focal position adjustment after having performed the leveling adjustment.

Figure 6A:
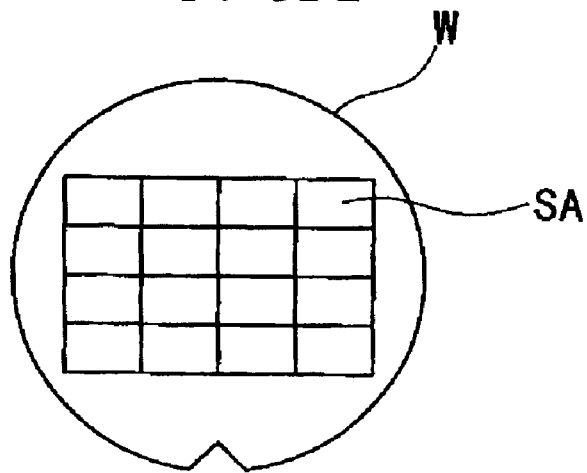
FIG. 6A is a diagram for explaining a shot area formed on the substrate and a chip area within the shot area.
Figure 6B:
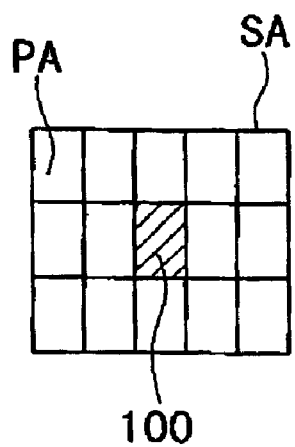
FIG. 6B is a diagram for explaining a shot area formed on the substrate and a chip area within the shot area.

In the case where thin-film magnetic heads are produced, as shown in FIG. 6A and FIG. 6B, a plurality of chip areas PA exist in the shot areas SA on the wafer W, and each of the plurality of chip areas PA becomes a device of the thin-film magnetic head. Therefore, by designating one chip area in the center of the shot areas as the above described flat portion 100, it is possible to keep the loss of the chips to a minimum, enabling production of more devices. With the present invention, the number of slit images for the focus detection and the number of flat portions corresponding thereto is not limited to one, and these may be provided at several places in the shot areas.

Figure 5:
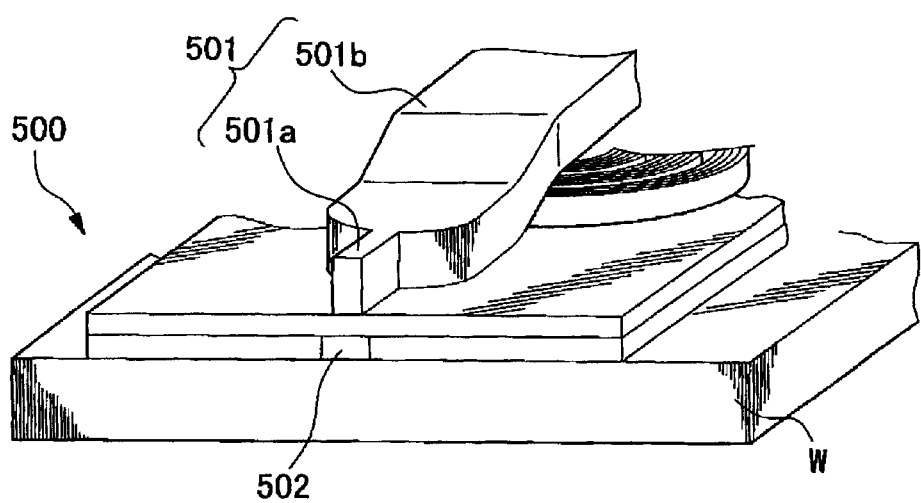
FIG. 5 is a diagram for explaining a layer construction of a thin-film magnetic head.

When thin-film magnetic heads as shown in FIG. 5 are produced by the above described exposure apparatus, a ceramic substrate is normally used as the substrate. Since the ceramic substrate has a higher coefficient of thermal expansion compared to that of the silicon substrate, overlapping error due to expansion and contraction becomes a big problem. Expansion and contraction of the substrate arises for example due to, the (development) processing of the substrate, resist application, film forming, etching processing or the like. Moreover, in the case where there is a temperature difference between the clean room and the chamber of the exposure apparatus, the substrate may be expanded or contracted.

When exposure is performed onto such a substrate W, the exposure apparatus shown in FIG. 1 can set at least one of, the time from mounting the substrate W on the substrate holding portion 32 until initiating exposure processing for the substrate W, the time from completing exposure processing for the substrate using a first mask until initiating exposure processing for the substrate using a second mask different from the first mask (a mask to be used next to the first mask), and the time from completing the exposure of a certain divided area, of a plurality of divided areas, on the substrate until initiating the exposure of the next divided area (shot area) to be exposed next. Here, initiation of the exposure processing may refer to a point in time when an operation for the exposure processing is initiated (or completed), for example, when the exposure light is irradiated onto the substrate W, or when the drive of the stage 30 is started for positioning the stage on which the substrate W is mounted directly under the projection optical system 20 so as to irradiate the exposure light onto the substrate W.

For example, after the exposure processing for one substrate W in one lot has been completed, the substrate W to be exposed next is supplied to the substrate holding portion 32 on the substrate stage 31 by, for example, a substrate loader, and vacuum-held. After completing the exposure processing for one substrate W, the time from when the next substrate W is vacuum-held by the substrate holding portion until initiating the exposure can be set beforehand. That is to say, there is the case where the substrate W is heated or cooled in a resist step or in a transport step, and thus expanded or contracted. If the focal position adjustment or leveling adjustment is performed in such a condition, precise face position detection cannot be performed, and the overlapping precision with the mask pattern at the time of exposure processing is poor. However, by leaving the substrate W to stand for a predetermined time in a state of being held by the substrate holding portion 32, then for example, the heated substrate W radiates heat to thereby become approximately the same temperature as that of the substrate holding portion 32. Consequently, the substrate W is subjected to the face position detection and the exposure processing, after the deformation due to the expansion has been corrected. Hence, the focal position adjustment, the leveling adjustment and the exposure processing are performed with high precision.

In this case, specifically the substrate W vacuum-attached by the substrate holding portion 32 by means of the substrate loader is maintained in the held condition by the substrate holding portion 32 for a predetermined time for radiating heat. Then, after the substrate W has radiated heat sufficiently, the condition of being vacuum-attached is once released to thereby release any stress applied to the substrate, and the substrate W is again vacuum-attached. Thereby, distortion occurred in the substrate W can be removed. The substrate W is exposed after having been subjected to the above described focal position adjustment and leveling adjustment. The substrate W having been through the exposure process is carried out of the substrate holding portion 32 by a substrate unloader, and the substrate W to be exposed next is supplied to the substrate holding position 32 by the substrate loader. Then, after waiting for a predetermined time as with the former substrate W, the substrate W is subjected to the formal position adjustment and the leveling adjustment and then exposed.

As described above, the time from after substrate W to be exposed is held by the substrate holding portion 32 until the exposure processing is initiated can be set so that the heated substrate W can radiate heat. Therefore the face position of the substrate W is detected in a stable condition, and the substrate W is subjected to the focal position adjustment, the leveling adjustment and the exposure processing with high precision. Here, a temperature adjusting unit may be provided between the substrate holding portion 32 and the substrate table 31. Thereby, the heat accumulated in the substrate holding portion 32 and the substrate table 31 can be removed, making it possible to maintain the temperature of the substrate holding portion 32 constant.

Moreover, for thin-film magnetic head 500 formed by a plurality of layers, there is a step for producing the head by a plurality of exposures using a plurality of masks M, and it is possible to set the time from one exposure to the next to the exposure to be a predetermined time. That is to say, straight after having exposed one substrate W using a mask M1, if the next exposure processing is performed using a mask M2, the next exposure processing is performed onto the substrate W that is in a heated condition due to the exposure processing using the mask M1. Hence the overlapping precision of the layers is deteriorated. However, by making it possible to set time from exposure completion onto one substrate W to the next exposure initiation, the overlapping precision of layers is improved.

Such an exposure sequence will be specifically described. When the exposure is performed on the thin-film magnetic head 500 having a large stepped portion as shown in FIG. 5, it is difficult to perform exposure at one time onto the concave portion 501a and the convex portion 501b of the stepped portion. This because there is a difference in level of about 10 to 20 μm between the concave portion 501a and the convex portion 501b, and the concave portion 501a has a narrower line width than that of the convex portion 501b, and also the exposure time is long. Therefore, exposure is performed on the concave portion 501a of the stepped portion, using a mask M1 having a pattern to be projected onto the concave portion 501a, and thereafter, exposure is performed on the convex portion 501b, using a mask M2 having a pattern to be projected onto the convex portion 501b, in the same process program as that for when the concave portion 501a is formed. In this case, preferably a waiting time is set before forming the concave portion 501a and the convex portion 501b, and after having radiated heat, the substrate W is subjected to the focal position adjustment and the leveling adjustment.

In addition to the mode in which a waiting time can be set with respect to the exposure process for overlapping layers, a mode is also possible in which, for example, a time from exposure completion of a certain shot area of a plurality of shot areas on one substrate W to the exposure initiation of the next shot area can be set. In particular, when a recording core 501 and a reading head 502 that require high overlapping precision are formed, the influence of the overlapping error due to the expansion and contraction of the other layers. Moreover, during the waiting time the stage may be kept stationary at an exposure initiation position directly under the projection optical system, or the stage may be moved slowly toward the exposure initiation position.

Furthermore, the main control unit 40 in the exposure apparatus 1 may be supplemented with a function which selects a first detection mode for obtaining the face positional information by using a plurality of measurements points, and a second detection mode for obtaining the face positional information by using at least one measurement point selected from the plurality of measurement points, depending upon the condition of the stepped portion on the substrate W. That is to say, the main control unit 40 has a function as a selection device for selecting at least one measurement point to be used for detecting the face positional information for the substrate W from a plurality of measurement points, depending upon the condition of the layer already formed on the substrate W. In addition, the plurality of measurement points are set in advance for detecting the positional information for the substrate W in a direction vertical to the imaging face of the pattern.

When the focal position adjustment and the leveling adjustment of the substrate W having a pattern with a large difference in levels as with the thin-film magnetic head 500 is performed, in particular, when the leveling adjustment is performed, as described above, the balancing effect can be obtained by using as many adjustment points as possible, enabling precise leveling adjustment. In the case, however, the processing time becomes long. Therefore, when the difference in levels of the pattern formed on the substrate W is small, that is, if it is possible to detect the face position with high precision without using so many measurement points, the number of measurement points is decreased by selecting the second mode, for example, four measurement points (S1, S3, S5, S7) in the peripheral portion of the shot area are selected. By so doing, detection of face position is made possible with short processing time. Moreover, for example, even in the case where the focal position adjustment is performed for at least one measurement point, the focal adjustment position can be performed efficiently by selecting the second mode.

Further, the first detection mode and the second detection mode are selected according to the information related to the layer on the substrate layer W. In this case, for example, an operator may beforehand perform setting depending upon the layer, or the information for the mask M may be read and the first mode or the second mode determined automatically according to the information. At this time, as shown in FIG. 5, the first mode is selected (or in the second mode, many measurement points are selected) at the time of layer for particularly forming a record core 501 having a large difference in level, of the thin-film magnetic head 500, and fewer measurements points in the second detection mode are selected at the time of other layers having a relatively small difference in level, thereby enabling efficient and precise face position detection with a short processing time.

For the substrate W according to the present invention, not only the ceramic wafer for the thin-film magnetic head, but also a semiconductor wafer for semiconductor devices and a glass plate for liquid crystal display devices may be used. Moreover, for the exposure apparatus 1, not only is the invention applicable to exposure apparatus of the step and repeat method (stepper) wherein a pattern of a mask M is exposed in a state with the mask M and the wafer W stationary and the substrate W is sequentially moved step by step, but this is also applicable to the scanning type exposure apparatus of the step and scan method (scanning stepper) wherein a pattern of a mask M is exposed on a substrate W by simultaneously moving the mask M and the substrate W. For the kind of the exposure apparatus 1, not only is the invention applicable to exposure apparatus for producing the above described thin-film magnetic heads, but this can also be widely applied to exposure apparatus for producing liquid crystal display devices, or exposure apparatus for producing semiconductors, imagers (CCD) or masks M.

For the light source 53 for the illumination optical, not only can an omission line generated from a mercury lamp (g-rays(436 nm), h-rays (404.7 nm), i-rays (365 nm), a Krf excimer laser (248 nm), an Arf excimer laser (193 nm) or an $F_2$ laser (157 nm), be used, but also charged particle beams such as X-rays and electron beams may be used. For example, when electron beams are used, a thermionic emission type lanthanum hexaboride (LaB6) and tantalum (Ta) can be used as an electron gun. Furthermore, the higher harmonics such as from a YAG laser or a semiconductor laser may be used.

The magnification of the projection optical system may involved not only an equal magnification but also a reduction system or an enlarging system. Moreover, as the projection optical system 20, when far ultraviolet rays such as from an excimer laser are used, a material which transmits far ultraviolet rays, such as quartz and fluorite is used as a glass material, and when an $F_2$ laser is used, a catadioptric system or a dioptric system is used (also the mask M to be used is a reflection type mask). When an electron beam is used, an electron optical system comprising an electron lens and a deflector may be used as an optical system.

When a linear motor is used for the substrate table 31 and the mask holding portion 11, either an air floating type using an air bearing or a magnetic levitation type using Lorentz force or reactance force may be used. Moreover, the substrate table 31 and the mask holding portion 11 may be of a type which move along a guide, or a guideless type without a guide. Furthermore, the reaction force (ground) using a frame member. Similarly, the reaction force generated by the movement of the mask holding portion 11 may be removed mechanically to the floor (ground) using a frame member.

The exposure apparatus 1 of this embodiment cab be produced by incorporating the illumination optical system 50 and the projection optical system 20 comprising a plurality of optical elements, into the exposure apparatus 1 and performing optical adjustment, and mounting the mask holding portion 11 and the substrate table 31 comprising many mechanical parts on the exposure apparatus 1 and connecting wiring and piping, and performing overall adjustment (electrical adjustment, operation confirmation and the like). The production of the exposure apparatus 1 is preferably performed in a clean room where temperature and cleanliness and the like are controlled.

The semiconductor device and the liquid crystal display device are produced through a step for designing the function and performance of the device, a step for manufacturing masks M based on the designed step, a step for manufacturing a wafer W, a glass plate or the like, a step for exposing a pattern of the mask M onto the wafer W or the glass plate by the exposure apparatus 1 of the aforesaid embodiment, a step for assembling each, and an inspection step.

What is claimed is:

1. A method of exposing a substrate by projecting onto said substrate a pattern image formed on a mask, comprising steps of:
   irradiating measurement beams onto a plurality of places on a substrate, wherein said measurement beams include at least one first measurement beam and a plurality of second measurement beams, and at least one of a shape and a size of said first measurement beams on a surface of the substrate is smaller than that of the second measurements beams;
   detecting said plurality of measurement beams from said substrate; and
   adjusting a relative position of the pattern image projected and said substrate so as to dispose the surface of the substrate at the position of the pattern image projected based on a detection result of the first measurement beam, and adjusting an inclination of the surface of the substrate with respect to the pattern image projected based on a detection result of at least said second measurement beams.

2. An exposure method according to claim 1, wherein said at least one first measurement beam is irradiated onto at least one flat portion formed beforehand on said substrate.

3. An exposure method according to claim 2, wherein said flat portion includes a non-pattern area, onto which the pattern image of said mask formed within each of a plurality of shot areas formed on said substrate is not projected.

4. An exposure method according to claim 1, wherein said substrate is a substrate for producing thin-film magnetic heads.

5. A production method for semiconductor devices comprising a step for projection exposing a pattern on a mask onto a substrate by using the exposure method according to claim 1.

6. An exposure method according to claim 1, wherein:
   said plurality of measurement beams each have same wavelength respectively.

7. An exposure method according to claim 1, wherein:
   said plurality of measurement beams are irradiated onto the substrate through irradiation optical elements arranged along an optical axis.

8. An exposure method according to claim 1, wherein:
   said plurality of measurement beams from the substrate are detected through detection optical elements arranged along an optical axis.

9. An exposure method according to claim 1, further comprising:
   setting a waiting time so as to radiate the heat accumulated in the substrate before irradiating the plurality of measurement beams onto the substrate.

10. An exposure method according to claim 1, further comprising:
    releasing vacuum-attached condition of a substrate holder that holds said substrate so as to release any stress applied to the substrate, and vacuum-attaching the substrate again.

11. An exposure method according to claim 1, further comprising:
    selecting a plurality of second measurement beams from a plurality of measurement beams except to the first measurement beam.

12. An exposure method according to claim 1, wherein:
    selecting a plurality beam is arranged approximately in the center of said plurality of measurement beams irradiated onto the surface of said substrate.

13. An exposure apparatus for exposing a substrate by projecting onto said substrate a pattern image formed on a mask, said apparatus comprising:
    an irradiating system that irradiates measurement beams onto a plurality of places on a substrate, wherein said measurement beams include at least one first measurement beam and a plurality of second measurement beams, and at least one of a shape and a size of said first measurement beam on a surface of the substrate is smaller than that of the second measurement beams;
    a detection system arranged in a predetermined positional relationship to said irradiation system, that detects said plurality of measurement beams from said substrate; and
    an adjusting device, connected to said detection system, that adjusts a relative position of the pattern image projected and said substrate so as to dispose the surface of the substrate at the position of the pattern image projected base on a detection result of the first measurement beam, and adjusts an inclination of the surface of the substrate with respect to the pattern image projected based on a detection result of at least said second measurement beams.

14. An exposure apparatus according to claim 13, wherein:

said plurality of measurement beams have same wavelength respectively.

15. An exposure apparatus according to claim 13, wherein:

said irradiation system comprises irradiation optical elements arranged along an optical axis, and said plurality of measurement beams are irradiated onto the substrate through said irradiation optical elements.

16. An exposure apparatus according to claim 13, wherein:

said detection system comprises detection optical elements arranged along an optical axis, and said plurality of measurement beams from the substrate are detected through said detection optical elements.

17. An exposure apparatus according to claim 13, further comprising:

a controller that sets a waiting time so as to radiate the heat accumulated in the substrate before irradiating the plurality of measurement beams onto the substrate.

18. An exposure apparatus according to claim 13, further comprising:

a substrate holder that holds said substrate in vacuum-attached condition; and a controller that controls the substrate holder to release vacuum-attached condition of the substrate holder so as to release any stress applied to the substrate, and then vacuum-attaching the substrate again.

19. An exposure apparatus according to claim 13, wherein:

said detecting system comprises a selector that selects a plurality of second measurement beams from a plurality of measurement beams except for the first measurement beams.

20. An exposure apparatus according to claim 13, wherein:

said first measurement beam is arranged approximately in the center of said plurality of measurement beams irradiated onto the surface of said substrate.

21. A production method for an exposure apparatus for exposing a substrate by projecting onto said substrate a pattern image formed on a mask, said method providing:

an irradiation system for irradiating measurement beams onto a plurality of places on a substrate is provided, and a detection system arranged in a predetermined positional relationship to said irradiation system, for detecting said plurality of measurement beams from said substrate is provided, wherein in said irradiation system at least either one of the shape and size of at least one of said plurality of measurement beams on the surface of said substrate is smaller than at least either one of the shape and size of the other measurement beams on the surface of said substrate.

* * * * *